United States Patent
Shan et al.

(10) Patent No.: US 9,562,192 B2
(45) Date of Patent: Feb. 7, 2017

(54) ALIGNMENT METHOD AND LIQUID CRYSTAL DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Wenze Shan, Shanghai (CN); Chen Liu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 19 days.

(21) Appl. No.: 14/499,005

(22) Filed: Sep. 26, 2014

(65) Prior Publication Data
US 2015/0376506 A1    Dec. 31, 2015

(30) Foreign Application Priority Data
Jun. 30, 2014  (CN) .......................... 2014 1 0307560

(51) Int. Cl.
C09K 19/56    (2006.01)
C23C 14/34    (2006.01)
C23C 14/22    (2006.01)

(52) U.S. Cl.
CPC ............. *C09K 19/56* (2013.01); *C23C 14/225* (2013.01)

(58) Field of Classification Search
CPC .............................. C09K 19/56; C23C 14/225
USPC ...................................................... 204/192.14
See application file for complete search history.

(56) References Cited

FOREIGN PATENT DOCUMENTS

CN    1497315 A    5/2004

*Primary Examiner* — Rodney McDonald
(74) *Attorney, Agent, or Firm* — Alston & Bird LLP (57) ABSTRACT

An alignment method includes: (1) providing a substrate, applying a coating material formed from any two materials of aromatic dianhydrides, aromatic diamines or diamines containing biphenyl and hexyl in side groups; (2) sputtering a third material which is not coated in step (1) along a direction having an angle not equal to zero with the substrate for conducting a polymerization reaction with the two materials coated in step (1) to generate a reaction product; (3) thermally treating the reaction product. The diamine containing biphenyl and hexyl in side group reacts with the main group to form a side chain, and thus controls the pretilt angle while assisted with physical sputtering to sputter in a certain angle, thereby forming a pretilt direction.

14 Claims, 2 Drawing Sheets

ALIGNMENT METHOD AND LIQUID CRYSTAL DISPLAY PANEL

CROSS-REFERENCES TO RELATED APPLICATIONS

This application claims the benefit of priority to Chinese Patent Application No. 201410307560.1, filed with the Chinese Patent Office on Jun. 30, 2014 and entitled "ALIGNMENT METHOD AND LIQUID CRYSTAL DISPLAY PANEL", the content of which is incorporated herein by reference in its entirety.

TECHNICAL FIELD

The present invention relates to an alignment method and a liquid crystal display panel, and more particularly to a method of exerting an alignment effect on liquid crystal molecules by utilizing chemical materials and a liquid crystal display panel using the alignment method thereof.

BACKGROUND OF THE INVENTION

In the research or application of liquid crystals, the control of the rotational direction of liquid crystal molecules is an extremely important step and is generally referred to as liquid crystal alignment. The most common liquid crystal alignment method is coating alignment materials on films formed on the surface of the substrates, and then making the molecules of the alignment films to generate directional arrangements by means of rubbing. When liquid crystal molecules attract the alignment films and form an ordered liquid crystal arrangement in virtue of intermolecular forces, the effect of liquid crystal alignment is finally achieved. The method of rubbing alignment can provide strong alignment ability for liquid crystal molecules. However, during the process of rubbing, contaminations of static electricity, scratch, particles and dust may be resulted due to the friction of rubbing cloth. These contaminations often directly cause damages in liquid crystal devices resulting in a decrease in the product yields.

Therefore, in academia and industry, non-contact alignment methods are being developed for easily controlling the alignment mode of liquid crystal molecules and for avoiding the contaminations of static electricity and particles. The most widely applied non-contact alignment method is photo alignment, such as ultraviolet light alignment.

The photo alignment utilizes linear polarized ultraviolet light to irradiate on macromolecular polymer alignment films containing photosensitizers, allowing the macromolecular polymer to have the ability of alignment. The photo alignment is able to avoid contaminations on the surface of glass substrates, to align in a small area, to make patterned alignment through photomasks, and to control the parameters of liquid crystal units such as pretilt angle and anchoring energy, etc. by the angle of incident light and irradiation time. The photo alignment material is a polymer formed by bonding many monomer molecules.

Generally alignment materials for the photo alignment may be divided into three groups: the first group is photo crosslinking reaction: After the alignment film is irradiated by the linear polarization ultraviolet light, molecules in the direction of polarization will be bonded to form long-bond molecules, allowing the alignment film to have an anisotropic distribution, and the liquid crystal molecules are consequently arranged along with the direction of the long-bond molecules. The second group is photo degradation reaction: after the alignment film is irradiated, the long-bond molecules in the direction of polarization will be degraded by the ultraviolet light, making the alignment film to form an anisotropic distribution, therefore the liquid crystal molecules will be arranged along the direction of the undegraded long-bond molecules. The third group is photo isomerization (cis-trans): generally an alignment material containing azo molecules is used, and the alignment material will form different arrangement directions before and after irradiation.

However, the process of photo alignment method is complicated and has a high cost for the necessary raw materials. Thus, this method is not suitable for large scale production.

BRIEF SUMMARY OF THE INVENTION

In view of the above problems, embodiments of the present invention provide an alignment method and a liquid crystal display panel.

In an embodiment, an alignment method includes the following steps:

(1) Providing a substrate, applying a coating material that is formed from any two of an aromatic dianhydride, an aromatic diamine or a diamine containing biphenyl and hexyl in side groups;

(2) Sputtering a third material which is different from the coating material in step (1) along a direction which has an angle not equal to zero in relation to the substrate for conducting a polymerization reaction of the third material with the coating material to generate a reaction product;

(3) Thermally treating the reaction product of step (2).

In another embodiment, a liquid crystal display panel includes a top substrate, a bottom substrate, and an alignment film disposed on at least one of the top substrate and the bottom substrate. The alignment film is aligned by employing the alignment method above.

Compared to the prior art, the present invention has many advantages and benefits.

For example, the present invention provides a chemical process which causes a diamine containing biphenyl and hexyl in side group to react with the main group to form a side chain, and control the pretilt angle while supporting sputtering at a certain angle, thereby forming a pretilt direction. Through this method the side chain in polyimide is oriented. Under the effect of the interaction force between the side chains and the liquid crystal molecules, the liquid crystal molecules are oriented, achieving an alignment effect.

The method overcomes contaminations of static electricity, scratch, particles and dust resulted from the rubbing cloth in the conventional rubbing alignment method, and the process according to the present invention is simple, the raw materials are easily and readily available at low cost.

BRIEF DESCRIPTION OF THE DRAWINGS

The reference numerals of the FIG. 2 are listed below.

1—substrate 21—coating material in step (1) 22—third material.

The reference numerals of the FIG. 3 are listed below.

3—top substrate 2—alignment film 4—bottom substrate 5—liquid crystal molecules 6—liquid crystal layer.

DETAILED DESCRIPTION OF THE PREFERRED EMBODIMENTS

The present invention will be understood more fully from the detailed description given below and from the accompanying drawings of the preferred embodiments of the invention, which, however, should not be taken to limit the invention to the specific embodiments, but are for explanation and understanding only.

Figure 1:
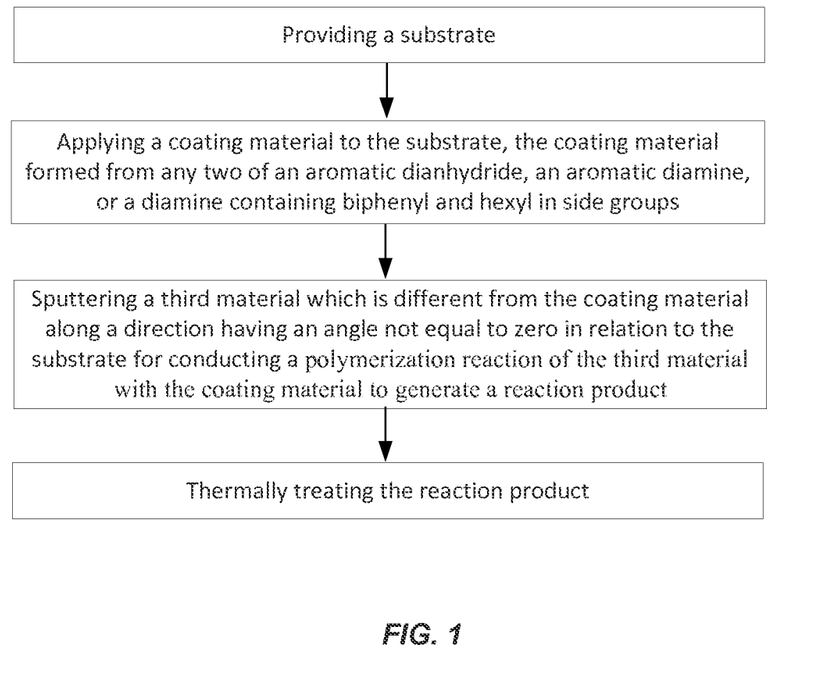
FIG. 1 is a flow chart diagram of an alignment method according to an embodiment of the present invention.

FIG. 1 is a flow chart diagram of an alignment method according to an embodiment of the present invention. The alignment method includes the following steps:

(1) Providing a substrate, applying a coating material that is formed from any two of an aromatic dianhydride, an aromatic diamine or a diamine containing biphenyl and hexyl in side groups;

(2) Sputtering a third material which is different from the coating material in step (1) along a direction which has an angle not equal to zero in relation to the substrate to conduct a polymerization reaction of the third material with the coating material to generate a reaction product;

(3) Thermally treating the reaction product of step (2).

Figure 2:
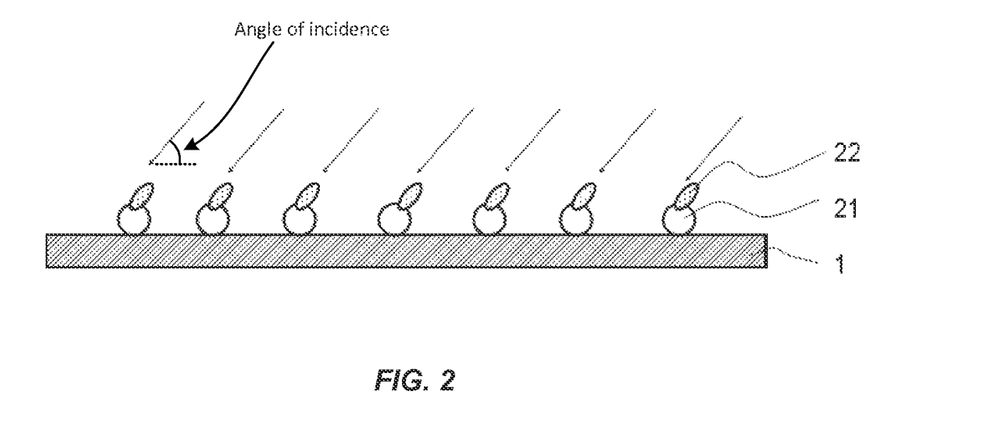
FIG. 2 is a simplified diagram illustrating an example polymerization reaction of a material with a coating material according to an embodiment of the present invention.

FIG. 2 is a simplified schematic diagram illustrating an example polymerization reaction of a material with a coating material according to an embodiment of the present invention. As shown, a coating material 21 that is formed from any two of the aromatic dianhydride, aromatic diamine or the diamine containing biphenyl and hexyl in side groups is coated on a substrate 1. A third material 22 is sputtered onto substrate 1 at a certain angle of incidence to conduct a polymerization reaction for generating a polyamide acid (PAA), wherein the direction of sputtering is the main direction to conduct the polymerization reaction. Thereafter, the polyamide acid, which is the product of the polymerization reaction, is thermally treated, and the polyamide acid is imidized, to obtain the final product polyimide (PI). Finally, the curing of polyimide is achieved, and the structure thereof is stabilized.

The present invention makes the diamine containing biphenyl and hexyl in side groups react with the main group to form a side chain by employing a chemical method, and thus controls the pretilt angle through controlling the mass percent of diamine group in side groups, while it is assisted with physical sputtering to sputter in a certain angle, thereby forming a pretilt direction. Through this method the side chain in polyimide is oriented. Under the effect of the interaction force between the side chains and the liquid crystal molecules, the liquid crystal molecules are oriented, achieving an alignment effect.

In an embodiment of the present invention, the aromatic dianhydride is an aromatic tetracarboxylic dianhydride.

In an embodiment of the present invention, the aromatic dianhydride has the following structure:

Wherein, $R_1$ and $R_2$ are independently selected from hydrogen atoms, fluorine atoms, a substituted or unsubstituted C1~C6 (e.g. C2, C3, C4 or C5) linear alkyl, a substituted or unsubstituted C1~C6 (e.g. C2, C3, C4 or C5) branched alkyl or a substituted or unsubstituted C1~C6 (e.g. C2, C3, C4 or C5) alkoxy.

When $R_1$ and $R_2$ both are hydrogen atoms, the aromatic dianhydride is pyromellitic dianhydride (PMDA). The structure thereof is as follow:

The polyimide obtained by employing pyromellitic dianhydride as a raw material has excellent thermal resistance, high-energy radiation resistance, electrical insulation properties, dielectric performance, and abrasion resistance.

In the present invention, the aromatic diamine is selected from any one of the compounds having one of the following structures, or a combination of at least two of the following structures:

Wherein, $R_3$, $R_4$, $R_5$ and $R_6$ are all independently selected from H atoms, fluorine atoms, a substituted or unsubstituted C1~C6 (e.g. C2, C3, C4 and C5) linear alkyl, a substituted or unsubstituted C1~C6 (e.g. C2, C3, C4 and C5) branched alkyl, a substituted or unsubstituted C2~C4 (e.g. C3) linear alkenyl, a substituted or unsubstituted C2~C4 (e.g. C3) branched alkenyl, a substituted or unsubstituted C2~C4 (e.g. C3) linear alkynyl, a substituted or unsubstituted C2~C4 (e.g. C3) branched alkynyl or a substituted or unsubstituted C1~C6 (e.g. C2, C3, C4 and C5) alkoxy. X is selected from hydrogen atom, a substituted or unsubstituted C1~C6 (e.g. C2, C3, C4 and C5) linear alkyl, a substituted or unsubstituted C1~C6 (e.g. C2, C3, C4 and C5) branched alkyl, sulfur atom, —CO— or —NH.

An exemplary aromatic diamine is such as 4,4'-diamino biphenyl methane (MDA), having the following structure:

During the process of forming the polyimide, the material sputtered last has a big influence on the final product and alignment. In the present invention, embodiments exemplarily showing different feeding sequences are as follows:

Embodiment 1

An alignment method comprises the following steps:
(1) Providing a substrate, thereon coating the aromatic dianhydride and the aromatic diamine;
(2) Sputtering the diamine containing biphenyl and hexyl in side groups along a direction which has an angle not equal to zero with (in relation to) the substrate, allowing it to react with the two materials coated in step (1) to generate a reaction product;
(3) Thermally treating the reaction product of step (2).

Embodiment 2

An alignment method, which comprises the following steps:
(1) Providing a substrate, thereon coating the aromatic dianhydride and the diamine containing biphenyl and hexyl in side groups;
(2) Sputtering the aromatic diamine along a direction which has an angle not equal to zero with the substrate, allowing it to react with the two materials coated in step (1) to generate a reaction product;
(3) Thermally treating the product of step (2).

Embodiment 3

An alignment method, which comprises the following steps:
(1) Providing a substrate, thereon coating the aromatic diamine and the diamine containing biphenyl and hexyl in side groups;
(2) Sputtering the aromatic dianhydride along a direction which has an angle not equal to zero with the substrate, allowing it to react with the two materials coated in step (1) to generate a reaction product;
(3) Thermally treating the product of step (2).

Feeding sequences have a strong influence on the structure of the final product and the alignment. Since the diamine containing biphenyl and hexyl in side groups bears big side groups, having a large steric-hindrance effect, if the diamine containing biphenyl and hexyl in side groups is sputtered at last, the diamine containing biphenyl and hexyl in side groups is mainly distributed at the both terminals of the polyimide segmer, having a big interactionforce with the liquid crystal molecules, beneficial for controlling the direction of the liquid crystal molecules. If other materials are sputtered at last, the diamine containing biphenyl and hexyl in side groups is mainly distributed in the middle of the polyimide segmer, thus the control ability for the liquid crystal molecules will be weakened. In the present invention, the third material uncoated in the step (1) may be the diamine containing biphenyl and hexyl in side groups. The diamine containing biphenyl and hexyl in side groups acts as an orientation agent in the present invention. The structure of the rigid biphenyl group and the flexible end on the side group of said diamine is similar to that of the liquid crystal molecule, and therefore the intermolecular force is strong. Sputtering the diamine containing biphenyl and hexyl in side groups at last can cause the side group to form at the outer portion of the polymer, in favor of controlling the direction of the liquid crystal molecules.

Optionally, in the three embodiments above, the aromatic diamine independently is 4,4'-diamino biphenyl methane (MDA); the aromatic dianhydride independently is pyromellitic dianhydride (PMDA); the diamine containing biphenyl and hexyl in side groups independently is 4-(4-(trifluoromethoxy)benzoyl)cyclohexyl-3,5-diamino benzoate (TBCA).

Optionally, in the present invention, the surface of the substrate is pretreated. The pretreatment refers to treating the surface of the substrate by employing a physical or chemical method before coating materials on the surface of the substrate. The pretreatment of the substrate can affect the molecular structure of the polyimide film, thereby affecting the growth of the film at later period. Exemplary methods for pretreating the substrate are as follows: the substrate is impregnated in acetone for 3 days to remove the impurities adhering on the surface and taken out for standby use; or the substrate is pretreated with the method disclosed in CN101506960. The purpose for pretreating the substrate lies in making the surface properties of the substrate uniform and controllable, facilitating the deposition of the films in later step.

Optionally, in the present invention, the method further comprises: before step (1), depositing a planarization layer above the substrate. Depositing the planarization layer above the substrate prior to performing step (1) may be necessary because there are circuits and electrodes on the surface of the substrate, leading to an uneven surface (a concave-convex-shape on the surface) of the substrate. During the process of sputtering, due to obstructions of the convex sites, the solution is unable to be sputtered to the sites obstructed by the convex or concave patterns, or the sputtering angle may deviate. Accordingly, depositing the planarization layer on the substrate can planarize the surface of the substrate, ensuring the integrity of sputtering and the accuracy of the sputtered angle. Optionally, the planarization layer is made of a transparent macromolecular material.

Optionally, in the present invention, the mass percent of the amount of the diamine containing biphenyl and hexyl in side groups relative to the total amount of diamines is ≤10%, for example 0.5%, 1%, 1.5%, 2%, 2.5%, 3%, 3.5%, 4%, 4.5%, 5%, 5.5%, 6%, 6.5%, 7%, 7.5%, 8%, 8.5%, 9% or 9.5%. The concentration of the diamines above can be set according to the preset angle of the pretilt angle.

In an alternative embodiment of the present invention, the mass (weight) percent of the amount of the diamine containing biphenyl and hexyl in side groups relative to the total amount of diamine may be in the range between 15% and 99%, for example 16%, 19%, 23%, 27%, 31%, 35%, 40%, 45%, 50%, 55%, 60%, 65%, 70%, 75%, 80%, 85%, 90% or 95%.

Since the diamine containing biphenyl and hexyl in side groups bears big side groups, the difference in the amounts of the diamine containing biphenyl and hexyl in side groups in polyimide molecules will have different influences in the structure of the polyimide molecular segmer, changing the interaction force between the side chain thereof and the liquid crystal molecules and finally affecting the orientation and the pretilt angle of the liquid crystal molecules. When the mass percent of the amount of the diamine containing biphenyl and hexyl in side groups relative to the total amount of diamines is ≤10%, the side chain density of the surface of the resulted polyimide alignment layer is smaller, insufficient to induce the liquid crystal molecules to form a vertical orientation. Optionally, display panels in plane switching (IPS) mode and twisted nematic (TN) mode are aligned by this alignment method. When the mass percent of the amount of the diamine containing biphenyl and hexyl in side groups relative to the total amount of diamines is 15% and above, the side chain density of the surface of the resulted polyimide alignment layer is sufficient to allow the liquid crystal molecules to orientate vertically. Hence, when the mass percent of the amount of the diamine containing biphenyl and hexyl in side groups relative to the total amount of diamines is in the range between 15% and 99%, it is beneficial for vertical orientation of the liquid crystal molecules. Optionally, the ratios of this concentration rage are utilized to conduct a vertical alignment (VA) to the display panels.

Further, different molar ratios of the aromatic dianhydride to the aromatic diamine will affect the pretilt angle of the liquid crystal molecules. The pretilt angle of the liquid crystal molecules firstly increases and then decreases, as the molar ratio of the aromatic dianhydride to the aromatic diamine increase. And when the molar ratio of the aromatic dianhydride, the aromatic diamine and the diamine containing biphenyl and hexyl in side groups is 104:60:40, the pretilt angle of the liquid crystal molecules is the biggest.

In an embodiment, the direction of sputtering and the substrate presents an angle in the range between 20° and 70°, for example 24°, 28°, 32°, 36°, 40°, 44°, 48°, 50°, 54°, 56°, 58°, 60°, 62°, 64°, 66° or 68°. Considering that when sputtering speed is slow the sputtered liquid is affected by gravity to change the direction of side chain formation, hence when considering the pretilt direction, the optional sputtering direction presents an angle of 20°~70° with the substrate, in which the direction has a better controllability within an angle of 30°~60°. Further, during the process of alignment, elevating the angle of sputtering reasonably also can avoid the concave-convex formed by circuits and electrodes on the surface of the substrate as possible, while achieving the predetermined alignment direction.

In an embodiment, the temperature of sputtering is 100° C. or below, for example 10° C., 15° C., 20° C., 25° C., 30° C., 35° C., 40° C., 45° C., 50° C., 55° C., 60° C., 65° C., 70° C., 75° C., 80° C., 85° C., 90° C. or 95° C. Optionally, the sputtering temperature is 60° C.~95° C. If the sputtering temperature is excessively low, the polymerization reaction among the three monomers will be unable to take place or take place slowly. If the temperature is excessively high, the polymerization of the polyimide (PI) macromolecular long chain will be affected.

In an embodiment, the pressure of sputtering is 0.2~10 kg/cm$^2$ and the speed of sputtering is 20~30 mm/s. The pressure of sputtering is for example 0.5 kg/cm$^2$, 1 kg/cm$^2$, 2 kg/cm$^2$, 3 kg/cm$^2$, 4 kg/cm$^2$, 5 kg/cm$^2$, 6 kg/cm$^2$, 7 kg/cm$^2$, 8 kg/cm$^2$ or 9 kg/cm$^2$. The speed of sputtering is for example 21 mm/s, 22 mm/s, 23 mm/s, 24 mm/s, 25 mm/s, 26 mm/s, 27 mm/s, 28 mm/s or 29 mm/s.

In the present invention, the term "sputtering speed" is referred to as the speed of the moving spray-head and nozzle relative to the substrate. The smaller the sputtering speed, the greater the concentration of organic matters per unit area. The term "sputtering pressure" is referred to as the internal pressure of the control site of the spray-head. The greater the sputtering pressure is, the higher the speed the organic matters is sputtered (ejected) from the nozzle is. When the sputtering pressure reaches above 0.2 kg/m², grooves are formed on the polyimide film to assist the alignment and to enhance the anchoring force of liquid crystals.

In an embodiment, the temperature of the thermal treatment is in the range between 100° C. and 300° C., for example 110° C., 120° C., 130° C., 140° C., 150° C., 160° C., 170° C., 180° C., 190° C., 200° C., 210° C., 220° C., 230° C., 240° C., 250° C., 260° C., 270° C., 280° C. or 290° C. The time for thermal treatment is 1~2 h, for example 1.1 h, 1.2 h, 1.3 h, 1.4 h, 1.5 h, 1.6 h, 1.7 h, 1.8 h or 1.9 h.

With an increase in temperature and time of thermal treatment, the degree of imidization is elevated and the pretilt angle is enlarged. This may be resulted from that, under a high temperature, the side chain easily starts a slack movement, migrates to the surface and is enriched, and is thereby able to induce the liquid crystal molecules to align better.

According to an exemplary embodiment 4, an alignment method comprises the following steps:

(1) Providing a substrate, thereon coating PMDA and MDA;

(2) Sputtering TBCA along with the direction presenting an angle of 20~70° with the substrate, allowing it to react with the two materials coated in step (1) to generate a reaction product;

(3) Under a condition of 100~300° C. thermally treating the product of step (2) for 1~2 h.

In the embodiment, PMDA and MDA are firstly coated, and then TBCA is sputtered. In the product formed last, TBCA is mainly distributed at the both terminals of the polyimide segmer, in favor of controlling the direction of the liquid crystal molecules. Meanwhile, sputtering with the angle above can avoid the concave-convex formed by circuits and electrodes on the surface of the substrate, in addition to evading the influence of the action of gravity.

In the embodiment 5 of the present invention, the sputtering direction of embodiment 4 is altered as:

Sputtering TBCA along with the direction presenting an angle of 30~60° with the substrate. The remainder of the alignment method is the same as the alignment method of embodiment 4.

The embodiment has a better controllability for selecting to sputter TBCA along with the direction presenting an angle of 30~60° with the substrate, in addition to possessing all the advantages possessed by embodiment 4.

In the embodiment 6 of the present invention, the same method as embodiment 4 is used for alignment. Besides, the mass (weight) percent of the amount of TBCA relative to the total amount of diamines is demanded to be controlled ≤10%.

The embodiment 6 of the present invention has achieved all the advantages possessed by the embodiment 4. Furthermore, since the embodiment 6 further selects the amount of TBCA, in the range of the amount, density of the side chain at surface of the resulted polyimide alignment film is smaller. Therefore, the resulted polyimide alignment film can be applied in liquid crystal display devices in IPS mode or TN mode, to obtain a smaller pretilt angle easily.

Further, in the embodiment, the pressure of sputtering may be selected to be 0.2~10 kg/cm², and the speed of sputtering may be selected to be 20~30 mm/s, so that grooves are formed on the polyimide film to assist the effect of alignment and enhance the anchoring force of liquid crystals.

In the embodiment 7 of the present invention, the same method as embodiment 4 is used for alignment. Besides, the mass percent of the amount of TBCA relative to the total amount of diamines is demanded to be controlled as 15~99%.

The embodiment 7 has achieved all the advantages possessed by embodiment 4. Furthermore, since the embodiment 7 further selects the amount of TBCA, in the range of amount, density of the side chain at surface of the resulted polyimide alignment film is sufficient to allow the liquid crystal molecules to orientate vertically. Hence, when the mass percent of TBCA relative to the total amount of diamines is 15~99%, it is beneficial for vertical orientation of the liquid crystal molecules, able to be applied in liquid crystal display devices in a VA display mode.

Optionally, in the embodiment, the pressure of sputtering is 0.2~10 kg/cm², and the speed of sputtering is 20~30 mm/s, so that grooves are formed on the polyimide film, having the effect of alignment assistance and enhancing the anchoring force of a liquid crystal.

To better illustrate the solutions of the present invention, the present invention lists the following specific examples, specifically as follows:

The table 1 below shows each process parameter in the specific examples.

TABLE 1

| Specific example | Amount of TBCA | Sputtering temperature ° C. | Angle between sputtering direction and substrate in degrees° | Sputtering pressure kg/cm² | Sputtering speed mm/s | Thermally treating time h | Thermally treating temperature ° C. |
|---|---|---|---|---|---|---|---|
| 1 | 5% | 10 | 20 | 0.2 | 20 | 1 | 100 |
| 2 | 10% | 20 | 30 | 1 | 22 | 1.2 | 140 |
| 3 | 15% | 40 | 40 | 3 | 24 | 1.4 | 180 |
| 4 | 40% | 60 | 50 | 5 | 26 | 1.6 | 220 |
| 5 | 70% | 80 | 60 | 7 | 28 | 1.8 | 250 |
| 6 | 99% | 100 | 70 | 10 | 30 | 2 | 300 |

The specific process is as follows:

(1) Impregnating ITO glass in acetone for 3 days to remove the impurities adhering on the surface and taking it out for standby use;

(2) Coating PMDA and MDA on the treated ITO glass;

(3) Sputtering TBCA along the direction presenting an angle shown in the table above with the substrate, by employing a MSP-3100A-type magnetron sputtering coating equipment, allowing it to react with the two materials coated in step (1) to generate a reaction product;

(3) Thermally treating the product of step (2), and obtaining the ITO glass coated with the polyimide film.

The resulted ITO glass is anti-parallelly assembled into a liquid crystal cell, with the polyimide film disposed inwards, and openings are set at both terminal ends for pouring liquid crystal in an isotropic state, followed by sealing the terminal ends to obtain the liquid crystal cell.

In the above-described embodiments, good alignment of the liquid crystal molecules can be achieved. Sputtering TBCA in a certain direction forms the pretilt direction of the liquid crystal molecules, in which, a better controllability can be obtained within an angle in the range between 30° and 60°. Moreover, when the amount of TBCA≤10%, it is insufficient to induce the liquid crystal molecules to occur a vertical orientation; when the amount of TBCA is 15% or above, the side chain density is sufficient to allow the liquid crystal molecules to orientate vertically. The amount of TBCA affects the pretilt angle of the liquid crystal molecules. The cooperation of the two factors above allows the liquid crystal molecules possess the pretilt direction and the pretilt angel. Also, the sputtering speed determines the concentration of the organic materials in unit area and the sputtering pressure determines the sputtering speed of the organic materials. Selecting the speed and pressure above can prevent the gravity of liquid to change the direction of side chain formation when sputtering. Further, when the sputtering pressure reaches above 0.2 kg/m², grooves are formed on the polyimide film, having the effect of alignment assistance, enhancing the anchoring force of a liquid crystal.

Optionally, PMDA in specific examples 1~6 can also be replaced with an aromatic dianhydride having the following structure:

Wherein, $R_1$ and $R_2$ are both independently selected from fluorine atoms; or, Wherein, $R_1$ and $R_2$ are both independently selected from methyl; or, Wherein, $R_1$ and $R_2$ are both independently selected from n-butyl; or, Wherein, $R_1$ is selected from methoxyl, $R_2$ is selected from hexyloxy.

Besides, MDA in the specific examples 1~6 above can be replaced with an aromatic diamine having the following structure:

Wherein, $R_3$ and $R_4$ are both selected from H atoms; or,

Wherein, $R_3$ and $R_4$ are both selected from fluorine atoms; or,

Wherein, $R_3$ is selected from methyl, $R_4$ is selected from n-hexyl; or,

Wherein, R$_3$ is selected from iso-hexyl, R$_4$ is selected from ethenyl, R$_5$ is selected from ethynyl, R$_6$ is selected from ethoxyl, and X is selected from sulfur atoms; or,

Wherein, R$_3$ is selected from methyl, R$_4$ is selected from ethenyl, R$_5$ is selected from ethynyl, R$_6$ is selected from methoxyl, and X is selected from —CO; or,

Wherein, R$_3$ is selected from methyl, R$_4$ is selected from n-hexyl, R$_5$ is selected from hydrogen atom, and R$_6$ is selected from fluorine atoms; or,

Wherein, R$_3$ is selected from methyl, R$_4$ is selected from n-hexyl, R$_5$ is selected from n-butyl, and R$_6$ is selected from n-pentyl; or,

Wherein, R$_3$ is selected from ethyl, R$_4$ is selected from propoxy; or,

Wherein, R$_3$ is selected from methyl, R$_4$ is selected from n-hexyl, and R$_5$ is selected from n-propyl; or,

Wherein, R$_3$ is selected from methyl, R$_4$ is selected from n-hexyl; or,

Wherein, R$_3$ is selected from hydrogen atom, R$_4$ is selected from n-hexyl; or,

Wherein, R$_3$ is selected from fluorine atom, R$_4$ is selected from n-hexyl, and R$_5$ is selected from proploxy; or,

Wherein, R$_3$ is selected from hydrogen atom, R$_4$ is selected from n-hexyl, R$_5$ is selected from 1-propenyl, and R$_6$ is selected from propargyl; or,

Wherein, $R_3$ is selected from hydrogen atom, $R_4$ is selected from fluorine atom, $R_5$ is selected from n-butenyl, and $R_6$ is selected from ethoxyl; or,

Wherein, $R_3$ is selected from hydrogen atom, $R_4$ is selected from fluorine atoms; or,

Wherein, $R_3$ is selected from n-butenyl, $R_4$ is selected from ethoxyl; or, Wherein, $R_3$ is selected from hydrogen atom, $R_4$ is selected from fluorine atoms; or, Wherein, $R_3$ is selected from hydrogen atom, $R_4$ is selected from methyl, $R_5$ is selected from n-butenyl, and $R_6$ is selected from ethoxyl; or, Wherein, $R_3$ is selected from hydrogen atoms, $R_4$ is selected from methyl, $R_5$ is selected from n-butenyl, and $R_6$ is selected from ethoxyl.

Optionally, parameters and conditions of each example embodiment are interchangeable.

Optionally, in step (1), in addition to applying a coating material to the substrate having any two materials described in the exemplary embodiments, the coating material may include other materials provided that the third material described in the exemplary embodiments is sputtered at a certain angle in step (2).

Optionally, the above-described alignment methods can be mixed or used in combination with other known alignment methods, for example used in combination with the rubbing alignment method and the photo alignment method.

Figure 3:
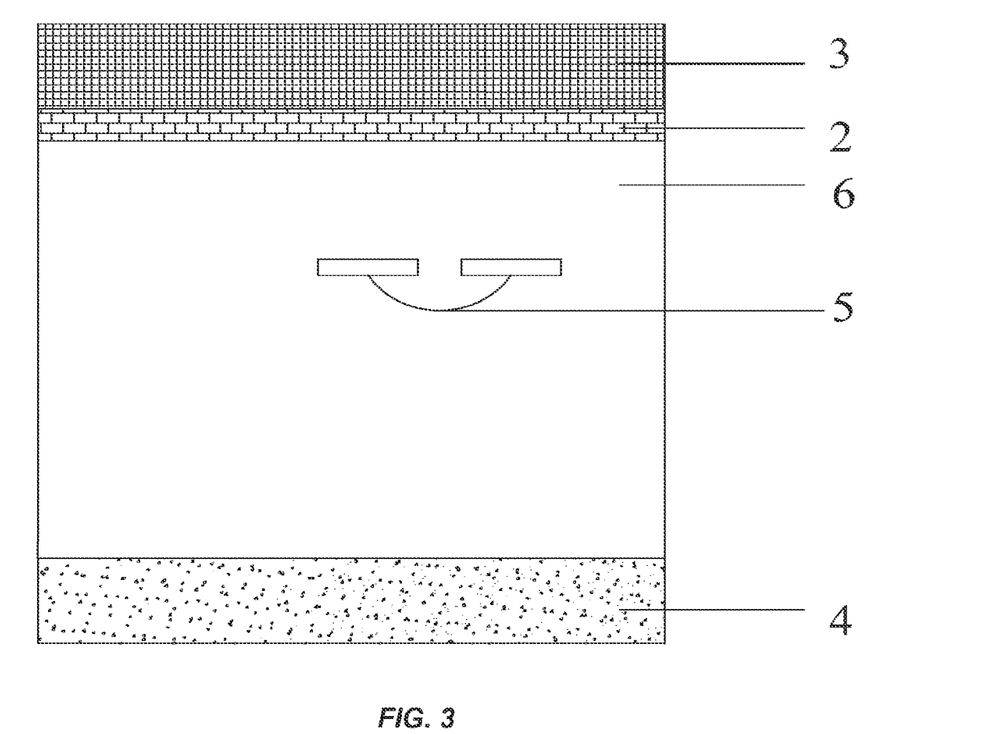
FIG. 3 is a simplified schematic diagram of the liquid crystal panel aligned according to an embodiment of the present invention.

In the present invention, the present invention also provides a liquid crystal display panel as shown in FIG. 3. The liquid crystal display panel comprises atop substrate 3 and a bottom substrate 4. An alignment film 2 is disposed on the top substrate 3. The alignment film 2 may be aligned by employing the above-described alignment methods. The liquid crystal display panel further includes liquid crystal molecules 5 forming a liquid crystal layer 6. The liquid crystal molecules 5 are orientated under the action of the alignment film 2.

In some embodiments, the alignment film 2 can also be disposed on the bottom substrate 4.

Embodiments of the present invention provide a method that uses a chemical reaction to cause a diamine containing biphenyl and hexyl in side groups to react with the main group to form a side chain and control the pretilt angle while supporting sputtering at a certain angle, thereby forming a pretilt direction. The side chain in polyimide is oriented, and the liquid crystal molecules are oriented, i.e., aligned in the same direction under the effect of the interaction force between the side chain and the liquid crystal molecules. The process according to the present invention is simple, the necessary raw materials are readily available and the costs are low. The present invention is thus suitable for large-scale production and overcomes the problems of the prior art associated with contaminations of static electricity, scratches and dust resulted from rubbing.

While the advantages and embodiments of the present invention have been depicted and described, there are many more possible embodiments, applications and advantages without deviating from the spirit of the inventive ideas described herein. It will be apparent to those skilled in the art that many modifications and variations in construction and widely differing embodiments and applications of the present invention will suggest themselves without departing from the spirit and scope of the invention.

What is claimed is:

1. An alignment method comprising the following steps:
(1) providing a substrate having a surface, applying a first material as the coating material to the surface of the substrate, the coating material being formed from any two of an aromatic dianhydride, an aromatic diamine, or a diamine containing biphenyl or hexyl in side groups;
(2) sputtering a second material different from the coating material in step (1) along a direction having an angle not equal to zero in relation to the substrate for conducting a polymerization reaction of the second material with the coating material to generate a reaction product; and
(3) thermally treating the reaction product of step (2).

2. The method according to claim 1, wherein the aromatic dianhydride is an aromatic tetracarboxylic dianhydride.

3. The method according to claim 1, wherein the aromatic dianhydride has the following structure:

wherein, $R_1$ and $R_2$ are independently selected from hydrogen atoms, fluorine atoms, a substituted or unsubstituted C1~C6 linear alkyl, a substituted or unsubstituted C1~C6 branched alkyl or a substituted or unsubstituted C1~C6 alkoxy.

4. The method according to claim 1, wherein the aromatic diamine is selected from any one of a substituted or unsubstituted phenylenediamine, biphenyl diamine, naphthalene diamine, anthracene diamine or phenanthrene diamine, or a combination of at least two of the substituted or unsubstituted phenylenediamine, biphenyl diamine, naphthalene diamine, anthracene diamine or phenanthrene diamine.

5. The method according to claim 1, wherein the aromatic diamine is selected from any one of compounds having one of the following structures, or a combination of at least two of the following structures:

wherein, $R_3$, $R_4$, $R_5$ and $R_6$ are all independently selected from hydrogen atoms, fluorine atoms, a substituted or unsubstituted C1~C6 linear alkyl, a substituted or unsubstituted C1~C6 branched alkyl, a substituted or unsubstituted C2~C4 linear alkenyl, a substituted or unsubstituted C2~C4 branched alkenyl, a substituted or unsubstituted C2~C4 linear alkynyl, a substituted or unsubstituted C2~C4 branched alkynyl or a substituted or unsubstituted C1~C6 alkoxy, X is selected from hydrogen atom, a substituted or unsubstituted C1~C6 linear alkyl, a substituted or unsubstituted C1~C6 branched alkyl, sulfur atom, —CO— or —NH.

6. The method according to claim 1, wherein, before step (1), the surface of the substrate is pretreated.

7. The method according to claim 1, further comprising: before step (1), depositing a planarization layer above the substrate.

8. The method according to claim 1, wherein a mass percent of an amount of the diamine containing biphenyl and hexyl in side groups relative to a total amount of the diamine is ≤10%.

9. The method according to claim 1, wherein a mass percent of an amount of the diamine containing biphenyl and hexyl in side groups relative to a total amount of the diamine is 15~99%.

10. The method according to claim 1, wherein the direction of sputtering in relation to the substrate presents an angle of 20°~70°.

11. The method according to claim 1, wherein the direction of sputtering in relation to the substrate presents an angle of 30°~60°.

12. The method according to claim 1, wherein a temperature of sputtering is 100° C. or below.

13. The method according to claim 1, wherein a pressure of sputtering is 0.2~10 kg/cm$^2$, and a speed of sputtering is 20~30 mm/s.

14. The method according to claim 1, wherein a temperature of the thermal treatment is 100~300° C., and a time duration for the thermal treatment is 1~2 h.

* * * * *